(12) United States Patent
Baerd et al.

(10) Patent No.: US 9,185,827 B2
(45) Date of Patent: Nov. 10, 2015

(54) ENERGY CONVERSION DEVICE, NOTABLY FOR A SYSTEM FOR ELECTRICALLY DRIVING AN UNDERWATER COMPRESSION AND PUMPING STATION

(75) Inventors: Henri Baerd, Champagne sur Seine (FR); Narayanaswamy Vedachalam, Chennai (IN)

(73) Assignee: GE ENERGY POWER CONVERSION TECHNOLOGY LIMITED (GB)

( * ) Notice: Subject to any disclaimer, the term of this patent is extended or adjusted under 35 U.S.C. 154(b) by 775 days.

(21) Appl. No.: 13/419,703

(22) Filed: Mar. 14, 2012

(65) Prior Publication Data

US 2013/0056180 A1    Mar. 7, 2013

(30) Foreign Application Priority Data

Mar. 14, 2011 (FR) ..................... 11 52037

(51) Int. Cl.
*H05K 7/20* (2006.01)
(52) U.S. Cl.
CPC ........ *H05K 7/20272* (2013.01); *H05K 7/20927* (2013.01)
(58) Field of Classification Search
CPC ................. H05K 7/20927; H05K 7/20272
USPC ............ 165/104.31, 104.11, 104.28; 361/676
See application file for complete search history.

(56) References Cited

U.S. PATENT DOCUMENTS

| 4,865,123 | A | * | 9/1989 | Kawashima et al. .... 165/104.33 |
| 6,145,584 | A | * | 11/2000 | Baynes et al. .................. 165/45 |
| 2008/0101023 | A1 | * | 5/2008 | Hsu ............................... 361/699 |
| 2010/0044016 | A1 | | 2/2010 | Frey |
| 2010/0051253 | A1 | * | 3/2010 | Dickey .......................... 165/247 |
| 2010/0139544 | A1 | | 6/2010 | Bo |
| 2010/0254087 | A1 | | 10/2010 | Godfroy et al. |
| 2010/0283338 | A1 | | 11/2010 | Grosskopf |
| 2011/0132579 | A1 | * | 6/2011 | Best et al. ................ 165/104.31 |
| 2012/0000630 | A1 | | 1/2012 | Reiss |

FOREIGN PATENT DOCUMENTS

| DE | 102008025951 B4 | 10/2010 |
| EP | 0766308 A2 | 4/1997 |
| EP | 1310759 | 5/2003 |
| EP | 2487327 A1 | 8/2012 |
| WO | 2007/055587 A1 | 5/2007 |

OTHER PUBLICATIONS

French Search Report dated Aug. 19, 2001 from EP1152037.

* cited by examiner

*Primary Examiner* — Jinhee Lee
*Assistant Examiner* — Keith Depew
(74) *Attorney, Agent, or Firm* — Parks Wood LLC

(57) ABSTRACT

The energy conversion device (10) includes a power module (14), elements (16) for cooling the power module (14), and a sealed enclosure (12) for housing the power module (14) and at least one portion of the cooling elements (16). The cooling elements (16) include a cooling circuit 18, in which a heat transfer fluid circulates, a first heat exchange (20) with the power module (14), through which passes the heat transfer fluid of the cooling circuit (18) and at least one pump (24) for driving the heat transfer fluid circulating in the circuit (18). The enclosure (12) includes an area (26) for receiving heat transfer fluid, filled with heat transfer fluid, and the cooling circuit (18) includes an inlet orifice (28) in the circuit (18) made upstream from the driving pump (24) and opening into the heat transfer fluid of the receiving area (26).

10 Claims, 2 Drawing Sheets

ENERGY CONVERSION DEVICE, NOTABLY FOR A SYSTEM FOR ELECTRICALLY DRIVING AN UNDERWATER COMPRESSION AND PUMPING STATION

FIELD OF THE INVENTION

The present invention relates to an energy conversion device, also called a converter, notably for a system for electrically driving an underwater compression and pumping station.

Such an underwater station is intended for oil or natural gas exploitation, generally in deep waters.

BACKGROUND OF THE INVENTION

Already in the state of the art, an energy conversion device is known, intended to equip an electric driving system for such an underwater compression and pumping station. Such an energy conversion device includes at least one power module intended to ensure the energy conversion function, in a way known per se.

The energy conversion device also includes means for cooling the power module, and a sealed enclosure for housing the power module and the cooling means.

Generally, the cooling means comprise a cooling circuit in which a heat transfer fluid circulates, passing through a heat exchanger with the power module. The cooling means also comprise at least one pump for driving the heat transfer fluid circulating in the circuit.

When the energy conversion device is installed in deep waters, it is difficult or even impossible to access it in order to conduct maintenance operations therein. Thus, this energy conversion device should be able to operate without requiring maintenance for a long period, generally for at least five years.

However, the pressure difference between the heat transfer fluid circulating in the cooling circuit and the inside of the enclosure, which may for example reach 10 bars, promotes the occurrence of leaks of the heat transfer fluid from the cooling circuit towards the inside of the enclosure, notably at the static and dynamic gaskets and at fittings used for the circuit. Such leaks may also occur as a result of degradations of the cooling circuit, for example, due to ageing.

Such leaks of the heat transfer fluid reduce the lifetime of the energy conversion device, such that it may be difficult to ensure a lifetime of at least five years for this energy conversion device.

SUMMARY OF THE INVENTION

The object of the invention is notably to find a remedy to this drawback, by providing an energy conversion device for which the lifetime is satisfactory even in the case of possible leaks of the heat transfer fluid.

For this purpose, the object of the invention is notably an energy conversion device, notably for a system for electrically driving an underwater compression and pumping station, including a power module, means for cooling the power module and a sealed enclosure for housing the power module and at least one portion of the cooling means, the cooling means comprising:
  a cooling circuit, in which a heat transfer fluid circulates,
  a first heat exchanger with the power module, through which passes the heat transfer fluid of the cooling circuit and,
  at least one pump for driving the heat transfer fluid circulating in the circuit; characterized in that:
  the enclosure includes an area for receiving a heat transfer fluid, filled with heat transfer fluid,
  the cooling circuit comprises an inlet orifice in the circuit, made upstream from the driving pump and opening into the heat transfer fluid of the receiving area.

In the case of a leak of heat transfer fluid from the circuit, this loss of heat transfer fluid generates negative pressure in the circuit, then causing suction through the inlet orifice. Since this inlet orifice opens into the heat transfer fluid of the receiving area, this fluid is sucked up so as to be reinjected into the circuit. In other words, heat transfer fluid is reinjected into the circuit in order to compensate for the leaks.

Thus, the cooling circuit may continue to operate efficiently even in the case of leaks.

Preferably, the cooling circuit is laid out above or in the receiving area so that possible leaks of the heat transfer fluid from the circuit fall by gravity into the receiving area.

An energy conversion device according to the invention may further include one or several of the following features, taken alone or according to all technically possible combinations:
  the inlet orifice is provided with an anti-return valve, only allowing the heat transfer fluid to pass from the receiving area to the cooling circuit;
  the energy conversion device comprises a filter laid out between the inlet orifice and the circuit;
  the heat transfer fluid is a dielectric fluid, for example a dielectric oil;
  the driving pump is laid out in the receiving area so as to be immersed in the heat transfer fluid of this receiving area;
  the receiving area extends in the enclosure so that the cooling circuit is immersed in the heat transfer fluid of this receiving area;
  the cooling circuit is laid out above the receiving area and is provided with a suction conduit, extending from a junction laid out upstream from the driving pump, as far as the inlet orifice which is immersed in the heat transfer fluid of the receiving area;
  the enclosure, except for the receiving area which is filled with heat transfer fluid, is filled with gas, preferably a neutral gas, for example nitrogen; and
  the receiving area extends in the whole enclosure, the energy conversion device including a pressure limiting device intended to limit the pressure in the enclosure by partly receiving the heat transfer fluid filling this enclosure when the heat transfer fluid expands.

The invention also relates to a system for electrically driving an underwater compression and pumping station, including at least one energy conversion device as defined earlier.

DETAILED DESCRIPTION OF THE INVENTION

The invention will be better understood upon reading the description which follows, only given as an example and made with reference to the appended figures, wherein FIGS. 1 to 4 each schematically illustrate an energy conversion device, according to a fourth exemplary embodiment of the invention respectively.

Figure 1:
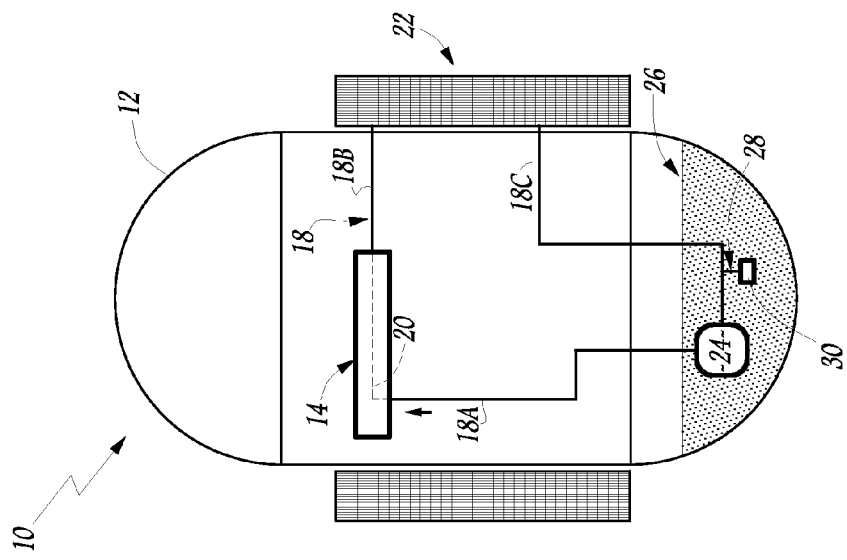
FIG. 1 depicts an energy conversion device intended to equip a system for electrically driving an underwater compression and pumping station.

An energy conversion device 10 according to a first exemplary embodiment of the invention is illustrated in FIG. 1.

The energy conversion device 10 is notably intended to equip a system for electrically driving an underwater compression and pumping station. Thus, this energy conversion device 10 is intended to be laid out on a seabed, at a depth generally comprised between a few meters and several kilometers.

The energy conversion device 10 includes a sealed enclosure 12, in which are housed a power module 14 and a means 16 for cooling the power module 14.

In a way known per se, the power module 14 includes power electronics elements and is able to ensure the energy conversion function.

The cooling means 16 include a cooling circuit 18 in which a heat transfer fluid circulates.

Advantageously, the heat transfer fluid is dielectric oil, such as silicone oil or oil marketed under the reference MIDEL 7131 by Midel®. The selection of such an oil as a heat transfer fluid notably has the advantage of not altering the dielectric strength of the equipment which would be sprayed with this fluid, and also of not increasing the humidity in the enclosure 12 in the case of a leak.

The cooling means 16 also include a first heat exchanger 20 of a standard type, intended for exchanging heat with the power module 14, through which passes the cooling circuit 18. The first heat exchanger 20 for example has the shape of a hollow plate, against which are laid out the power electronics elements of the module 14, and in which the heat transfer fluid circulates. The heat exchanger may also include means for heat exchange by forced circulation through components of the power module 14, such as resistors and coiled elements.

The cooling means 16 also include a second outer heat exchanger 22 of a standard type, laid out outside the enclosure 12, so that the heat transfer fluid circulating in this second heat exchanger 22 exchanges heat with the surroundings of the energy conversion device 10, i.e. sea water. It will be noted that sea water notably at great depth, usually has a temperature of less than ten degrees Celsius, generally about equal to four degrees Celsius.

Alternatively, the second heat exchanger 22 may be laid out inside the enclosure 12, in direct contact with the wall of this enclosure 12, so as to draw away the calories towards the outer sea water surrounding this enclosure 12.

Thus, the heat transfer fluid collects heat energy from the power module 14 via the first heat exchanger 20 and delivers the heat energy to sea water via the second heat exchanger 22.

The cooling means 16 finally include at least one pump 24 for driving the heat transfer fluid circulating in the circuit 18. Preferably, the cooling means 16 include at least one back up pump laid out in parallel with the pump 24, so as to form redundancy of pumps which may take over in the case of malfunction of the pump 24.

Advantageously, the pump 24 is of the volumetric type.

The circuit 18 includes at least one first branch 18A extending between the pump 24 and the first exchanger 20, at the outlet of the pump 24, at least one second branch 18B extending between the first 20 and the second 22 exchanger, and at least one third branch 18C extending between the second exchanger 22 and the pump 24, at the inlet of this pump 24.

The enclosure 12 includes an area 26 for receiving heat transfer fluid, filled with heat transfer fluid identical with or of a similar type to the one circulating in the cooling circuit 18.

According to this first embodiment, the cooling circuit 18 is laid out above the receiving area 26. Thus, in the case of leaks of the cooling circuit 18, the escaping heat transfer fluid flows by gravity into the receiving area 26.

The cooling circuit 18 moreover comprises an inlet orifice 28 in the circuit 18, made upstream from the driving pump 24, opening into the heat transfer fluid of the receiving area 26.

In the case of leaks of the cooling circuit 18, the loss of heat transfer fluid in the circuit 18 generates negative pressure therein, causing suction through the inlet orifice 28. Since this inlet orifice 28 opens into the heat transfer fluid of the receiving area 26, this heat transfer fluid is then sucked up so as to be reinjected into the cooling circuit 18. The leaks of heat transfer fluid from the circuit 18 are therefore automatically compensated, which allows the cooling circuit 18 to continue to operate even in the case of leaks.

Advantageously, the inlet orifice 28 is provided with an anti-return valve 30, only allowing the heat transfer fluid to pass through from the receiving area 26 towards the cooling circuit 18. Such an anti-return valve 30 avoids the loss of heat transfer fluid from the circuit through the orifice 28.

Preferably, a filter 32 is laid out between the inlet orifice 28 and the circuit 18, in order to prevent impurities dwelling in the enclosure 12 from entering the circuit 18.

According to this first embodiment, the receiving area 26 extends at the bottom of the enclosure 12. In this case, the cooling circuit 18 includes a suction conduit 34 extending from a junction 36 with the third branch 18C of the circuit 18, as far as the inlet orifice 28 which is immersed in the heat transfer fluid of the receiving area 26. The filter 32 is laid out on this suction conduit 34, as this is illustrated in FIG. 1.

It will be noted that the enclosure 12, except for the receiving area 26 which is filled with heat transfer fluid, is filled with gas, preferably a neutral gas such as, for example nitrogen. Such a neutral gas has the advantage of limiting corrosion of the elements dwelling therein and of avoiding propagation of possible fires.

Figure 2:
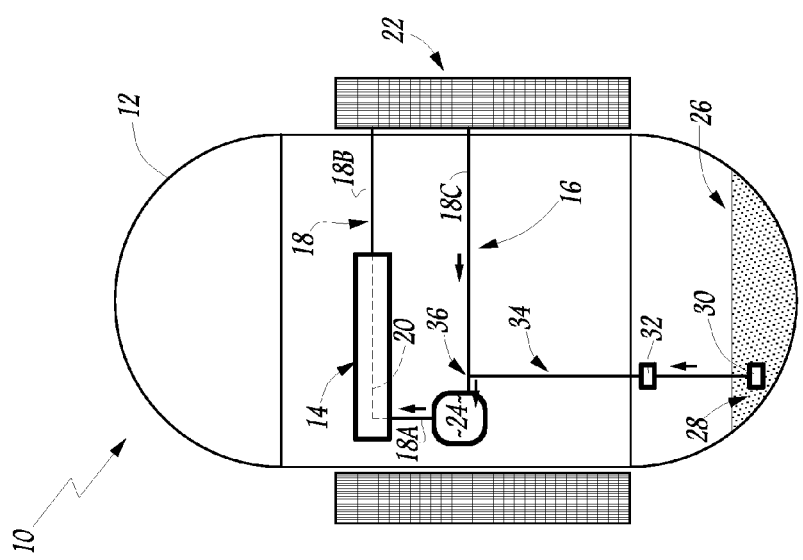
FIG. 2 depicts an energy conversion device in which the driving pump is laid out in the receiving area, so as to be immersed in the heat transfer fluid filling this receiving area.

An energy conversion device 10 according to a second exemplary embodiment of the invention is illustrated in FIG. 2. In this figure, the elements like those of the previous figure are designated by identical references.

According to the second embodiment, the driving pump 24 is laid out in the receiving area 26, so as to be immersed in the heat transfer fluid filling this receiving area 26. Thus, unlike the first embodiment, this energy conversion device 10 does not include any suction conduit 34, the inlet orifice 28 being directly laid out on the third branch 18C of the circuit 18.

Thus, possible leak problems on such a suction conduit 34 are avoided.

Figure 3:
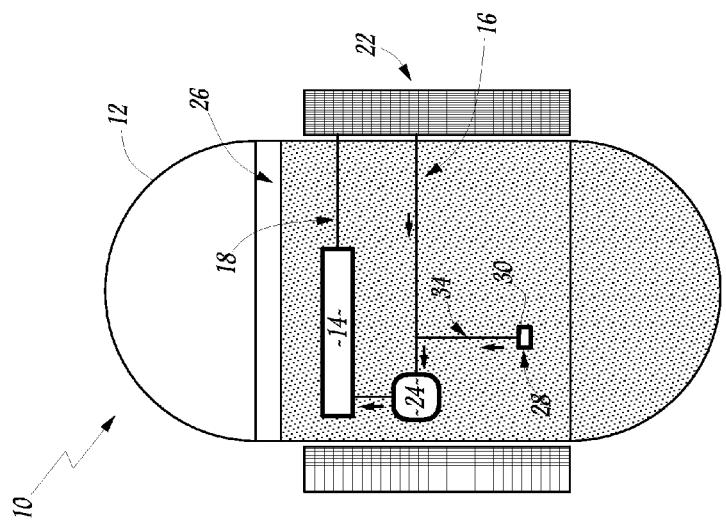
FIG. 3 depicts an energy conversion device in which the receiving area extends in the enclosure so that the cooling circuit is entirely immersed in the heat transfer fluid of this receiving area.

A third exemplary embodiment of the invention is illustrated in FIG. 3. In this figure, the elements like those of the previous figures are designated by identical references.

According to this third embodiment, the receiving area 26 extends in the enclosure 12 so that the cooling circuit 18 is entirely immersed in the heat transfer fluid of this receiving area 26.

It will be noted that in this embodiment, the enclosure 12 has an area 35 filled with neutral gas. Thus, in the case of expansions, notably thermal expansions, of the heat transfer fluid of the receiving area 26, the respective volumes of the receiving areas 26 and of neutral gas 35 vary depending on the expansions of the heat transfer fluid. The volume of heat transfer fluid may therefore increase in the enclosure 12, without generating any excessive internal pressure. The internal pressure of the enclosure 12 thus remains comprised between rated pressure thresholds for maintaining in good condition the elements housed in this enclosure 12. As an example, in order to allow the use of standard equipment for making the device 10, the internal pressure of the enclosure 12 is of the order of 1 bar.

In the example of FIG. 3, the cooling circuit 18 includes a suction conduit 34. However, as an equivalent alternative, the inlet orifice 28 may be directly made on the third branch 18C.

Figure 4:
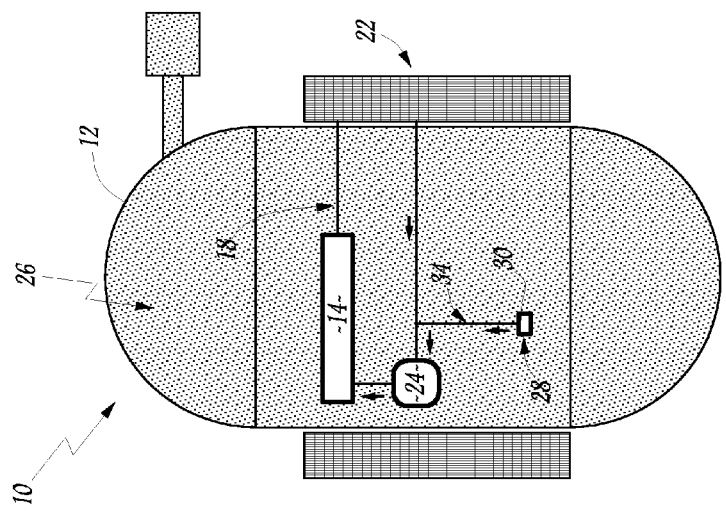
FIG. 4 depicts an energy conversion device in which the receiving area extends into the whole enclosure.

An energy conversion device 10 according to a fourth exemplary embodiment of the invention is illustrated in FIG. 4. In this figure, the elements like those of the previous figures are designated by identical references.

According to this fourth embodiment, the receiving area 26 extends into the whole enclosure 12. In other words, the enclosure 12 is filled with heat transfer fluid.

In this case, the energy conversion device 10 includes a pressure limiting device 38, intended for limiting the internal pressure of the enclosure 12, for example by partly receiving the heat transfer fluid of this enclosure 12 in the case of expansion of this heat transfer fluid.

The cooling circuit 18 is entirely immersed in the heat transfer fluid of the receiving area 26, this cooling circuit 18 is similar to that of the third embodiment described earlier.

It will be noted that this embodiment gives the possibility of predicting an inner pressure of the enclosure 12 substantially equal to the outer pressure surrounding this enclosure 12. In this case, the walls limiting the enclosure 12 may be selected so as to be thinner than in the previous embodiments.

It will be noted that the invention is not limited to the embodiments described earlier, but may have various alternatives without departing from the scope of the claims.

The energy conversion device 10 may in particular include a more complex cooling circuit than the one described earlier, or include several power modules.

The invention claimed is:

1. An energy conversion device for electrically driving an under water compression and pumping station, including a power module, means for cooling the power module, and a sealed enclosure for housing the power module, and at least one portion of the cooling means, the cooling means comprising:
   a cooling circuit, in which a heat transfer fluid circulates,
   a first heat exchanger with the power module, through which the heat transfer fluid of the cooling circuit passes, and
   at least one pump for driving the heat transfer fluid circulating in the circuit, characterized in that:
   the enclosure includes an area (26) for receiving heat transfer fluid, filled with heat transfer fluid,
   the cooling circuit comprising an inlet orifice in the circuit made upstream from the driving pump, and opening into the heat transfer fluid of the receiving area, wherein the inlet orifice is provided with an anti-return valve, allowing the heat transfer fluid to pass from the receiving area to the cooling circuit.

2. The energy conversion device according to claim 1, comprising a filter positioned between the inlet orifice and the circuit.

3. The energy conversion device according claim 1, wherein the heat transfer fluid is a dielectric fluid, for example a dielectric oil.

4. The energy conversion device according to claim 1, wherein the driving pump is positioned in the receiving area so as to be immersed in the heat transfer fluid of this receiving area.

5. The energy conversion device according to claim 4, wherein the receiving 30 area extends in the enclosure so that the cooling circuit is immersed in the heat transfer fluid of this receiving area.

6. The energy conversion device according to claim 1, wherein the cooling circuit is positioned above the receiving area, and is provided with a suction conduit, extending from a junction positioned upstream from the driving pump, as far as the inlet orifice which is immersed in the heat transfer fluid of the receiving area.

7. The energy conversion device according to claim 1, wherein the enclosure, except for the receiving area which is filled with heat transfer fluid, is filled with gas, preferably a neutral gas, for example nitrogen.

8. The energy conversion device according to claim 1, wherein the receiving area extends in the whole enclosure, the energy conversion device including a pressure limiting device, intended to limit the pressure in the enclosure by partly receiving the heat transfer fluid filling this enclosure when this heat transfer fluid expands.

9. A system for electrically driving an under water compression and pumping station, including at least one energy conversion device according to claim 1.

10. The energy conversion device according to claim 1, comprising a filter positioned between the inlet orifice and the circuit.

* * * * *